United States Patent
Farrar

(10) Patent No.: US 7,655,095 B2
(45) Date of Patent: Feb. 2, 2010

(54) METHOD OF CLEANING SEMICONDUCTOR SURFACES

(75) Inventor: Paul A. Farrar, Bluffton, SC (US)

(73) Assignee: Micron Technology, Inc., Boise, ID (US)

(*) Notice: Subject to any disclaimer, the term of this patent is extended or adjusted under 35 U.S.C. 154(b) by 347 days.

(21) Appl. No.: 11/605,065

(22) Filed: Nov. 28, 2006

(65) Prior Publication Data
US 2007/0072368 A1    Mar. 29, 2007

Related U.S. Application Data

(62) Division of application No. 10/681,481, filed on Oct. 8, 2003.

(51) Int. Cl.
*B08B 7/00* (2006.01)
(52) U.S. Cl. .............................. 134/6; 134/1.3; 438/906
(58) Field of Classification Search .................. None
See application file for complete search history.

(56) References Cited

U.S. PATENT DOCUMENTS

| | | | |
|---|---|---|---|
| 4,817,652 A | | 4/1989 | Liu |
| 4,944,837 A | * | 7/1990 | Nishikawa et al. ............ 216/41 |
| 4,962,776 A | | 10/1990 | Liu et al. |
| 5,013,366 A | * | 5/1991 | Jackson et al. .................. 134/1 |
| 5,185,296 A | | 2/1993 | Morita et al. |
| 5,304,515 A | | 4/1994 | Morita et al. |
| 5,456,759 A | | 10/1995 | Stanford, Jr. et al. |
| 5,900,354 A | | 5/1999 | Batchelder |
| 6,071,439 A | | 6/2000 | Bawa et al. |
| 6,149,828 A | | 11/2000 | Vaartstra |
| 6,242,165 B1 | | 6/2001 | Vaartstra |
| 6,306,754 B1 | | 10/2001 | Agarwal |
| 6,558,475 B1 | | 5/2003 | Jur et al. |
| 6,666,986 B1 | | 12/2003 | Vaartstra |
| 6,800,142 B1 | | 10/2004 | Tipton et al. |
| 7,064,070 B2 | | 6/2006 | Mullee et al. |
| 7,303,637 B2 | | 12/2007 | Farrar |
| 2003/0116176 A1 | | 6/2003 | Rothman et al. |
| 2003/0228738 A1 | | 12/2003 | Beaudoin |
| 2004/0211440 A1 | * | 10/2004 | Wang et al. ..................... 134/2 |
| 2005/0076935 A1 | | 4/2005 | Farrar |
| 2006/0289033 A1 | | 12/2006 | Farrar |

OTHER PUBLICATIONS

Wolf, S., et al., "Chpt 15 "Wet Processing: Cleaning, Etching and Liftoff"", *Silicon Processing for the VLSI Era*, vol. 1—Process Technology, Lattice Press, Snset Beach, CA, (1986),514-520.

* cited by examiner

*Primary Examiner*—Michael Cleveland
*Assistant Examiner*—Nicole Blan
(74) *Attorney, Agent, or Firm*—Schwegman, Lundberg & Woessner, P.A.

(57) ABSTRACT

Devices and methods of cleaning are described. The methods, and devices formed by the methods have a number of advantages. Embodiments are shown that include cleaning using a supercritical fluid. Advantages include a combination of both chemical and mechanical removal abilities from the supercritical fluid. Mechanical energy for cleaning is transmitted in a homogenous manner throughout a carrier fluid. The mechanical energy provided in methods shown can also be used with delicate surface features.

24 Claims, 6 Drawing Sheets

METHOD OF CLEANING SEMICONDUCTOR SURFACES

This application is a divisional of U.S. application Ser. No. 10/681,481 filed Oct. 8, 2003, which is incorporated herein by reference in its entirety.

TECHNICAL FIELD

This invention relates to cleaning methods. Specifically this invention relates to a method of cleaning high density semiconductor wafers, chips and assemblies of chips.

BACKGROUND

The development of high density ULSI circuits with submicron dimensions has lead to the requirement to remove unwanted contaminants from the surface of the wafers used in the production of structures such as high density chips along with the high density multichip assemblies constructed from these chips. This becomes especially difficult in examples such as a trench in the trench capacitor; deep contacts necessitated by stacked capacitors in dynamic random access memories (DRAMS); or the use of the damascene process in the production of copper metallurgy. High density assemblies e.g. those using flip chip or cube packaging also present significant cleaning challenges. One example of a type of material to be removed includes the residuals left from a film in which all or a portion of is to be removed. One example of such a film is a photo-resist. Another example of a type of material to be removed includes incidental contaminates.

Depending upon the type of contaminant, it may be attached to the surface by mechanisms such as chemical bonding, mechanical attachment, or a combination of chemical and mechanical mechanisms. The minimum dimensions of particles to be removed has continued to decrease as the minimum feature size has decreased. This has been aggravated by the fact that the vertical dimensions in the chips have not tended to shrink as fast as the horizontal dimensions thus making relatively deeper holes for contaminate particles to be lodged in. Further, in chip assemblies, the use of smaller diameter solder balls in C4 connections have reduced the vertical dimension between the chip and the substrate thus making the removal of contaminates from the space more difficult.

What is needed is an improved method for cleaning surfaces and structures in small dimensions such as those produced in semiconductor manufacture.

DETAILED DESCRIPTION

Figure 1:
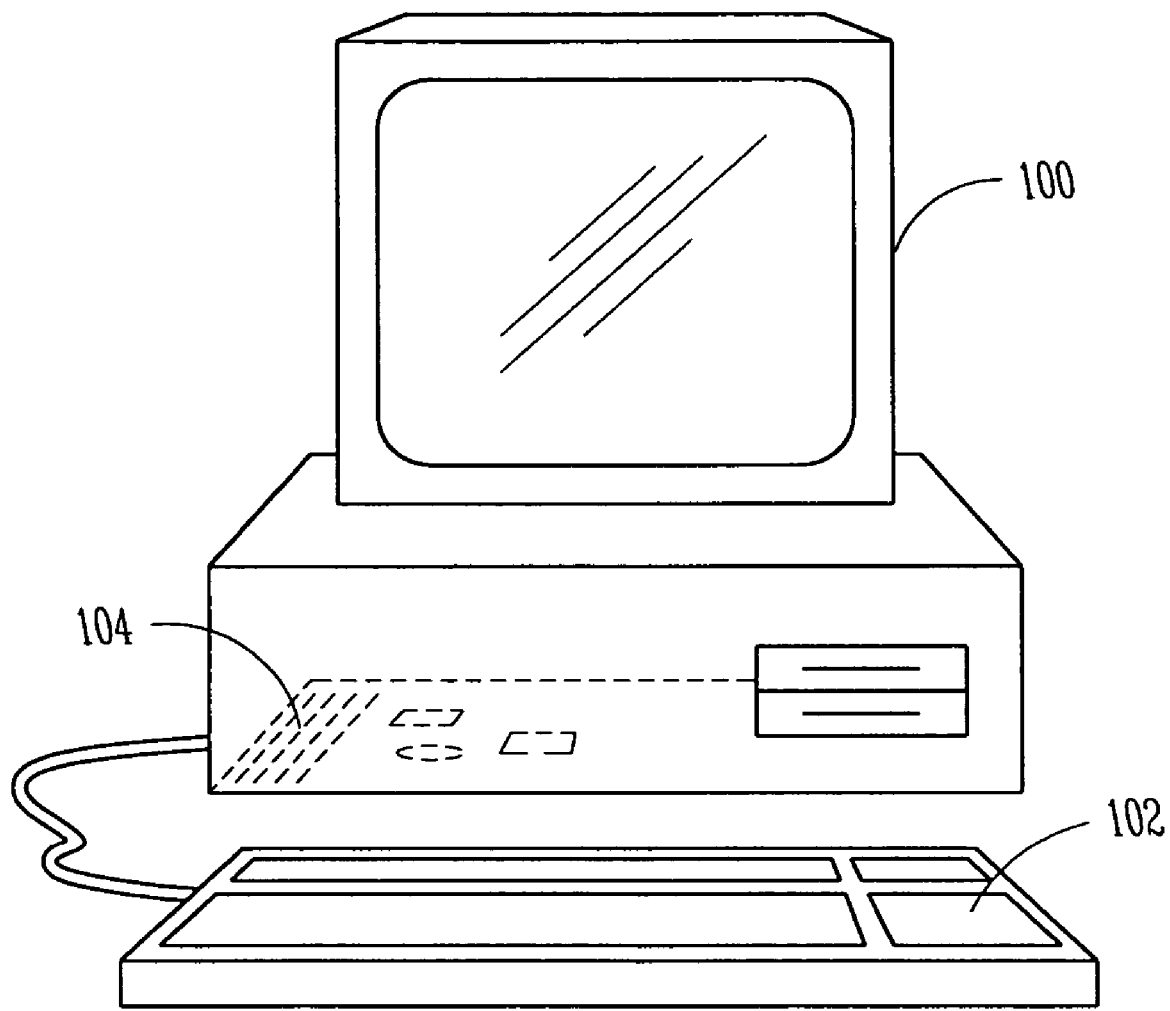
FIG. 1 shows an information handling system according to an embodiment of the invention.

In the following detailed description, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers and first level packaging. The term substrate is also used to refer to semiconductor structures during processing, and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors. The term chip assembly, as used in this application includes the joining of one or more chips to each other and or to a chip carrier.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The disclosed cleaning methods and devices are particularly applicable to the cleaning of any surface with intricate or fragile features. Although a number of types of surfaces are within the scope of the invention, the cleaning of a semiconductor chip or wafer surface is used in the following description as an example. Semiconductor chips, assemblies of chips, or semiconductor wafers are included in higher level devices or methods of forming devices such as information handling systems or personal computers. In one embodiment, the personal computer shown in FIGS. 1 and 2 includes chips formed using methods described below.

Figure 2:
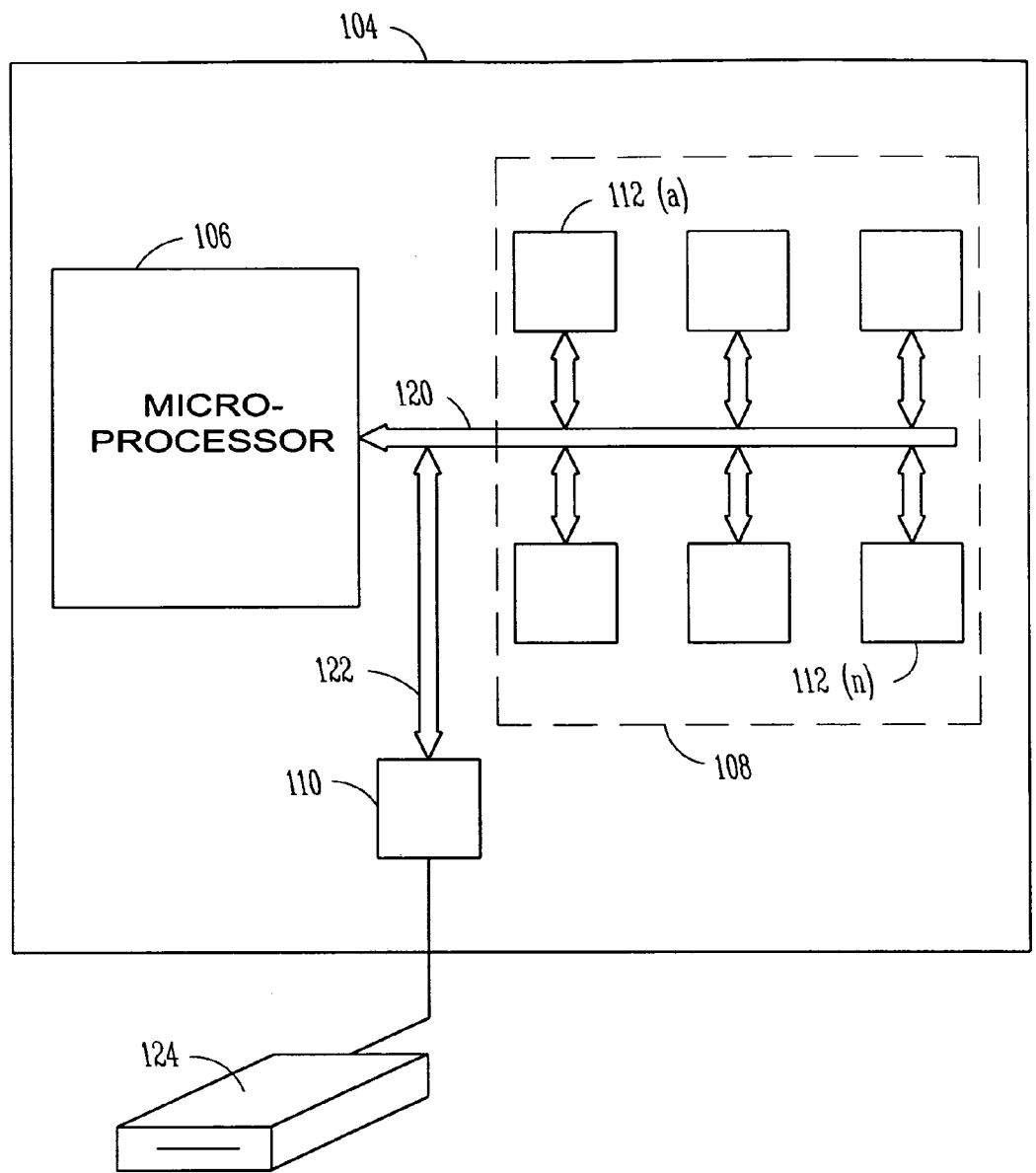
FIG. 2 shows a block diagram of a processing unit according to an embodiment of the invention.

The personal computer shown in FIGS. 1 and 2 includes a monitor 100, keyboard input 102 and a central processing unit 104. The processor unit typically includes microprocessor chip or chips 106, memory bus circuit 108 having a plurality of memory slots 112(a-n), and other peripheral circuitry 110. Peripheral circuitry 110 permits various peripheral devices 124 to interface processor-memory bus 120 over input/output (I/O) bus 122.

Microprocessor 106 produces control and address signals to control the exchange of data between memory bus circuit 108 and microprocessor 106 and between memory bus circuit 108 and peripheral circuitry 110. This exchange of data is accomplished over high speed memory bus 120 and over high speed I/O bus 122.

Coupled to memory bus 120 are a plurality of memory slots 112(a-n) which receive memory devices. For example, single in-line memory modules (SIMMs) and dual in-line memory modules (DIMMs) may be used in the implementation of embodiments of the present invention. Those skilled in the art will recognize that a wide variety of memory devices with memory chips may be coupled to the plurality of memory slots 1 12(a-n). Acceptable memory devices include, but are not limited to, SDRAMs, SLDRAMs, RDRAMs and other DRAMs and SRAMs, VRAMs and EEPROMs, may be used in the implementation of the present invention. One of ordinary skill in the art, having the benefit of the present disclosure, will recognize that chips can be used in chip assemblies i.e. packages which include one or more chips.

Figure 3:
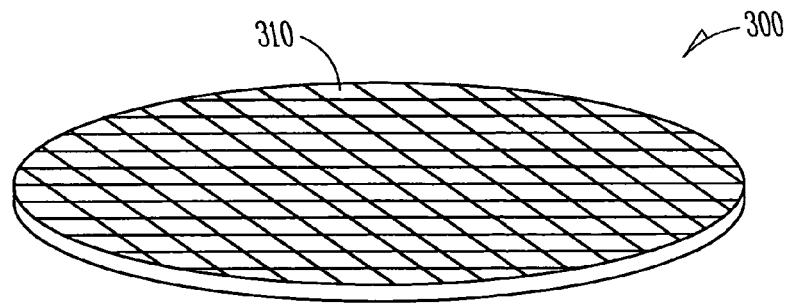
FIG. 3 shows a semiconductor wafer according to an embodiment of the invention.

FIG. 3 shows a wafer 300 of semiconductor material. Semiconductor materials include, but are not limited to, silicon, gallium arsenide, silicon-on-insulator structures, etc. The wafer 300 includes a number of individual chips 310. The chips 310 may be configured to include several types of integrated circuits on single or multiple chips such as memory circuits, processor circuits, application specific circuits, etc. In one embodiment, after processing according to methods described below, the wafer 300 is divided or diced into the respective number of chips 310. The individual chips are then incorporated into higher level systems or devices such as illustrated in FIGS. 1 and 2. In one embodiment, methods of cleaning a semiconductor surface are used to clean a surface of a wafer 300. In one embodiment, methods of cleaning a semiconductor surface are used to clean an individual chip 310 after a dicing operation. In one embodiment, methods of cleaning a semiconductor surface are used to clean an assembly of chips.

Figure 4A:
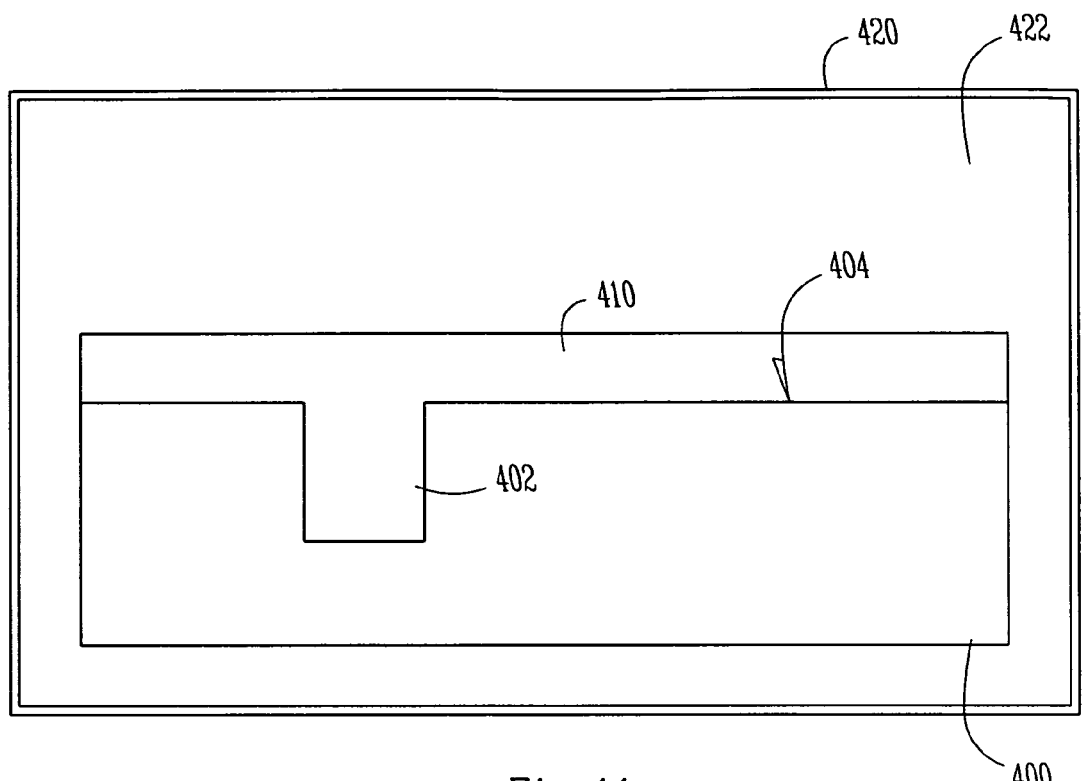
FIG. 4A shows a stage in processing a surface according to an embodiment of the invention.

FIG. 4A shows a portion of a semiconductor 400 including a feature 402. In one embodiment, the semiconductor 400 includes a chip or collection of chips. In one embodiment, the semiconductor 400 includes a wafer. In one embodiment, the feature 402 includes a trench. In one embodiment, the feature 402 includes a protruding feature. Other features normally used in the formation of semiconductor devices are also within the definition of the feature 402. For illustration, the feature 402 shown in FIGS. 4A-4D is a trench.

A processing layer 410 is shown covering a surface 404 of the semiconductor 400. Several types of processing layers 410 are included within the scope of the invention. In one embodiment, the processing layer 410 includes a photoresist material. In one embodiment, the processing layer 410 includes a nitride masking layer. In one embodiment, the processing layer 410 includes an oxide layer. In one embodiment, the processing layer 410 includes a metal layer. Other semiconductor fabrication layers are also within the scope of the invention. As shown in FIG. 4A, the processing layer 410 is formed both on the surface 404 of the semiconductor 400 and closely contouring the feature 402.

In one embodiment, the semiconductor 400 is processed within an enclosed chamber 420. In one embodiment, the chamber 420 is used for multiple processing operations. In one embodiment, a number of separate chambers 420 are used to complete a semiconductor fabrication process. In one embodiment, a gas atmosphere 422 within the chamber can be controlled by varying a number of physical variables. In one embodiment, the variables include thermodynamic variables such as pressure, volume, and temperature.

Figure 4B:
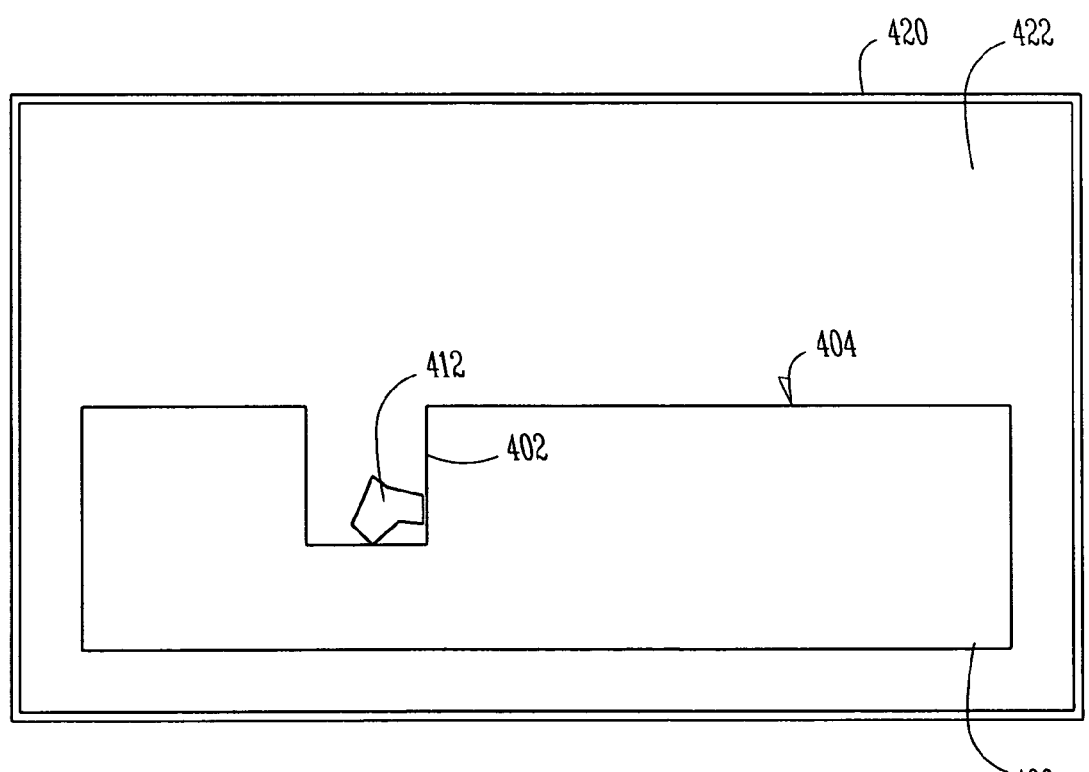
FIG. 4B shows a stage in processing a surface according to an embodiment of the invention.

FIG. 4B shows the semiconductor 400 after a removal operation. In one embodiment, the condition of the semiconductor 400 shown in FIG. 4B corresponds to a level of cleaning achieved using current cleaning methods. An unwanted particle 412 is shown remaining within the feature 402. In one embodiment the particle 412 is a fraction of material remaining from incomplete removal of the processing layer 410. In one embodiment, the particle 412 is a foreign particle that was deposited along with the processing layer 410. In one embodiment, the particle 412 includes a foreign particle from a semiconductor processing operation separate from deposition or removal of the processing layer 410.

In one embodiment, the removal operation used to create the condition in FIG. 4B includes introducing a solvent solution to the surface 404 of the semiconductor 400. In one embodiment, the particle 412 remains behind after the removal operation due to incomplete dissolution of the processing layer 410 in the solvent solution. In one embodiment, the particle 412 remains behind due to a particle material that dissolves poorly or does not dissolve in the solvent solution.

Figure 4C:
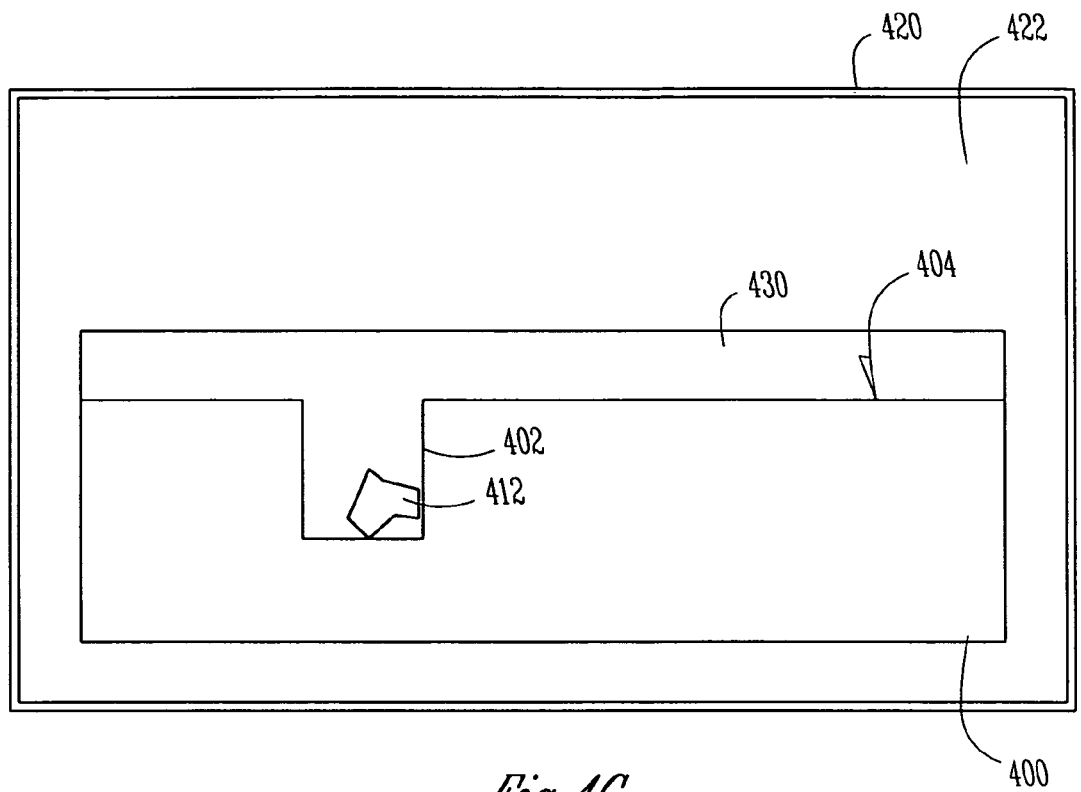
FIG. 4C shows a stage in processing a surface according to an embodiment of the invention.

FIG. 4C shows the surface 404 of the semiconductor 400 and the remaining particle 412 within the feature 402. A carrier fluid 430 is further shown adjacent to the surface 404 of the semiconductor 400. In one embodiment, the carrier fluid 430 includes the solvent solution used to remove the processing layer 410. In one embodiment, the carrier fluid 430 includes a subsequent cleaning or solvent solution. Carrier fluids include, but are not limited to, de-ionized water, $H_2SO_4$, and $H_2O_2$. In one embodiment, only selected surfaces of the semiconductor 400 are introduced to the carrier fluid 430. In one embodiment, the entire semiconductor 400 is immersed within the carrier fluid 430.

In one embodiment, the atmosphere 422 within the chamber 420 is adjusted to alter a state of the atmosphere 422. In one embodiment, the atmosphere 422 is altered during a processing time when the surface 404 of the semiconductor 400 and the feature 402 are exposed to the carrier fluid 430. In one embodiment, atmosphere is altered to change the atmosphere to a supercritical state. An atmosphere 422 or environment is determined to be in a supercritical state (and is referred to as a supercritical fluid) when it is subjected to a combination of pressure and temperature above its critical point, such that its density approaches that of a liquid (i.e., the liquid and gas states are indistinguishable). A wide variety of compounds and elements can be converted to the supercritical state.

In one embodiment, the supercritical state is achieved by varying a temperature within the chamber 420. In one embodiment, the supercritical state is achieved by varying a pressure within the chamber 420. In one embodiment, the supercritical state is achieved by varying both a temperature and a pressure within the chamber 420. In one embodiment, carbon dioxide is used to form a supercritical fluid. Carbon dioxide has advantages such as low cost, and moderate temperature and pressure conditions necessary to form a supercritical state. In a carbon dioxide embodiment, a temperature includes 32° C. and a pressure of 73 Atm.

In addition to a carbon dioxide atmosphere embodiment, other suitable atmospheres 422 include, but are not limited to, nitrous oxide, ethane, ethylene, propane, and xenon. In one embodiment, the supercritical state includes a supercritical fluid formed from one of the gases listed above. In one embodiment the supercritical fluid includes ethyl alcohol, ethyl ether or methyl alcohol.

After formation of the supercritical fluid, the supercritical fluid formed from the atmosphere 422 and the carrier fluid 430 mix together to form a substantially homogenous fluid. Under this condition, the homogenous fluid substantially surrounds the particle 412 within the feature 402.

Figure 4D:
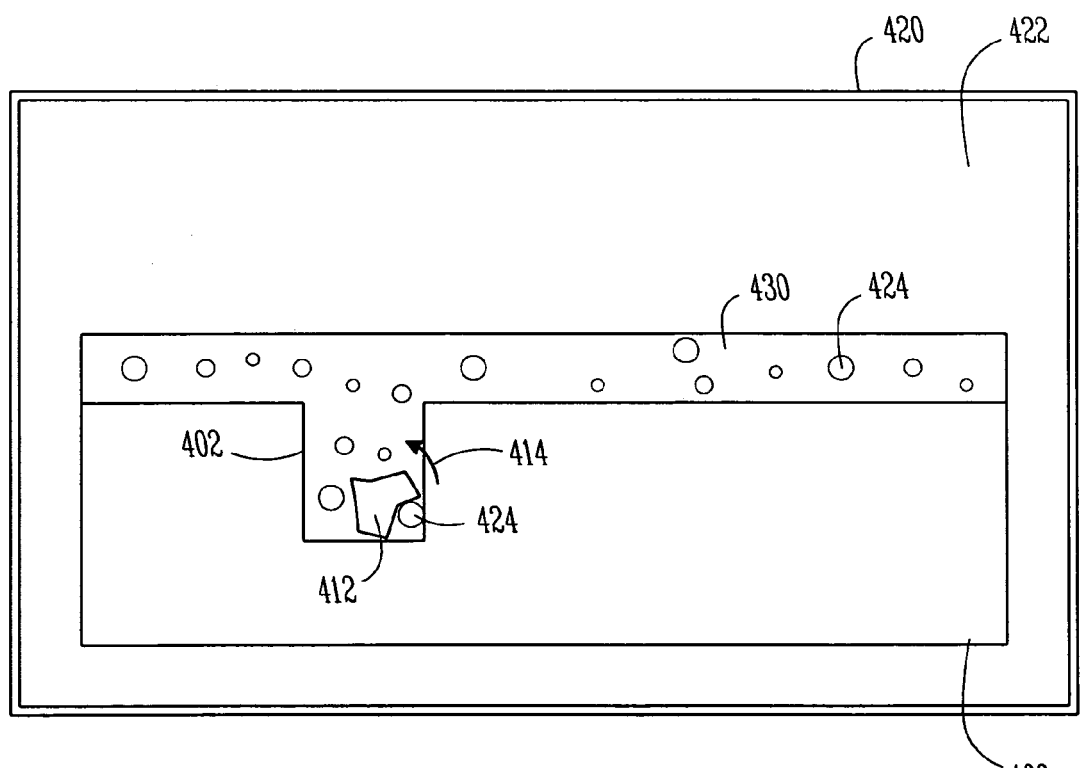
FIG. 4D shows a stage in processing a surface according to an embodiment of the invention.

FIG. 4D shows the surface 404 of the semiconductor 400 and the remaining particle 412 within the feature 402 from FIG. 4C. The atmosphere 422 within the chamber 420 is altered a second time to remove conditions within the chamber 420 from the supercritical state. FIG. 4D shows a number of bubbles 424 forming at random locations within the carrier fluid 430. In one embodiment, after the supercritical conditions within the chamber 420 are removed, the supercritical fluid component of the homogenous fluid returns to a gas state, causing the bubbles 424 to form.

FIG. 4D shows a bubble forming adjacent to the particle 412. The energy provided by the expanding gas of the bubble 424 dislodges the particle 412, allowing it to be flushed away by the carrier fluid. The energy provided by the expanding bubble is effective for removal of the particle 412 because it provides mechanical energy to dislodge mechanical/physical constraints on the particle 412. The energy provided by the expanding bubble is further effective to break any bonding of the particle 412 to the semiconductor 400 such as Van der Waals bonding, or electrostatic bonding.

Using a supercritical fluid as described in embodiments above has a number of advantages. Supercritical fluids are recognized as a good solvent for many types of materials. A selected supercritical fluid can therefore provide both a chemical removal mechanism for some materials, and a mechanical removal mechanism for other non-dissolved particles as described in embodiments above.

Another advantage of methods and devices described above includes a homogenous delivery of energy to the surface being cleaned. Other mechanical cleaning methods such as sonic bath cleaning can create harmonic "hot spots" at locations on the surface where constructive wave interference amplifies the mechanical energy. Although sonic bath methods add additional energy for more effective cleaning, in some cleaning situations, the sonic hot spots can damage sensitive surface features.

Another advantage of methods and devices described above includes the ability to use supercritical fluid techniques with existing cleaning processes and cleaning solutions. For example, in a current dry cleaning process, de-ionized water is used to rinse a surface of a semiconductor surface. A supercritical fluid method as described above can be used to form bubbles in the de-ionized water. Likewise, in a wet cleaning example, a solution such as $H_2SO_4$ or $H_2O_2$ is used to clean the semiconductor surface. A supercritical fluid method as described above can be added to this wet cleaning example to form bubbles in the $H_2SO_4$ or $H_2O_2$ solutions. In processes such as those used for multichip assemblies where fluxes and or organic residues are present, chlorocarbons or chlorofluorocarbons may be used as a carrier fluid.

Figure 5:
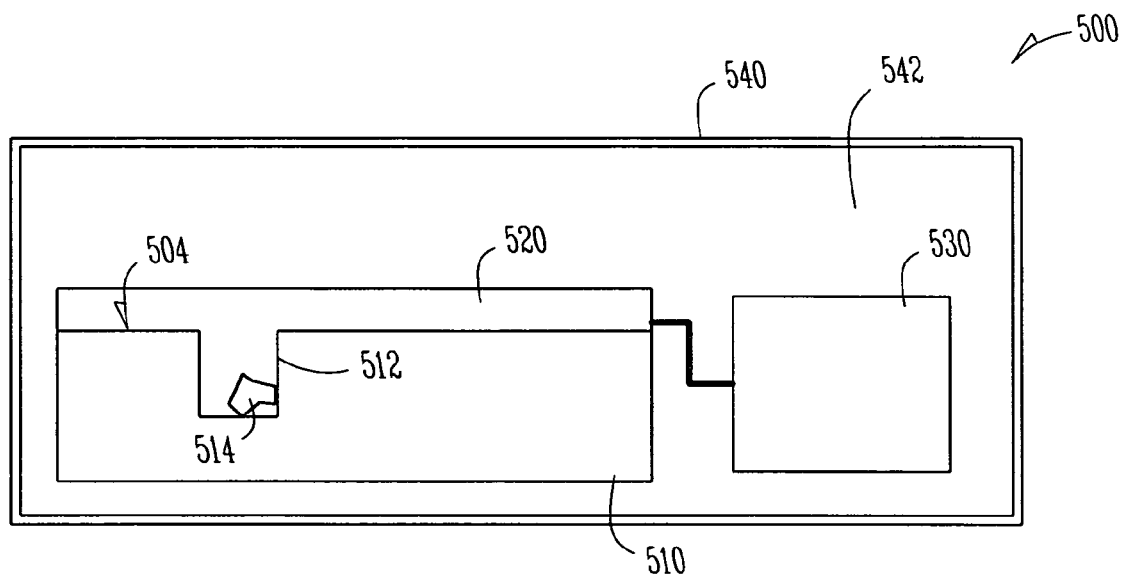
FIG. 5 shows a cleaning system according to an embodiment of the invention.

FIG. 5 shows a cleaning system 500. A portion of a semiconductor 510 is shown including a feature 512. An unwanted particle 514 is shown within the feature. A carrier fluid 520, similar to carrier fluids described in embodiments above, is shown in contact with a surface 504 of the semiconductor 510. Similar to embodiments described above, the surface 504 of the semiconductor, the feature 512 and the particle 514 are contained within a chamber 540. The atmosphere 542 within the chamber 540 can be controlled to produce a supercritical state. As described in embodiments above, mechanical energy for cleaning particles such as particle 514 is provided by altering a supercritical state to produce bubbles.

In addition to the use of the supercritical state for mechanical energy, a sonic wave generation system 530 is shown in block diagram form, coupled to the carrier fluid 520. In some embodiments, mechanical energy in addition to that provided by the supercritical fluid is desirable for removal of unwanted particles. In one embodiment, the sonic wave generation system 530 includes ultrasonic energy. In one embodiment, the sonic wave generation system 530 includes megasonic energy. Other frequencies of wave generation are also within the scope of the invention.

Figure 6:
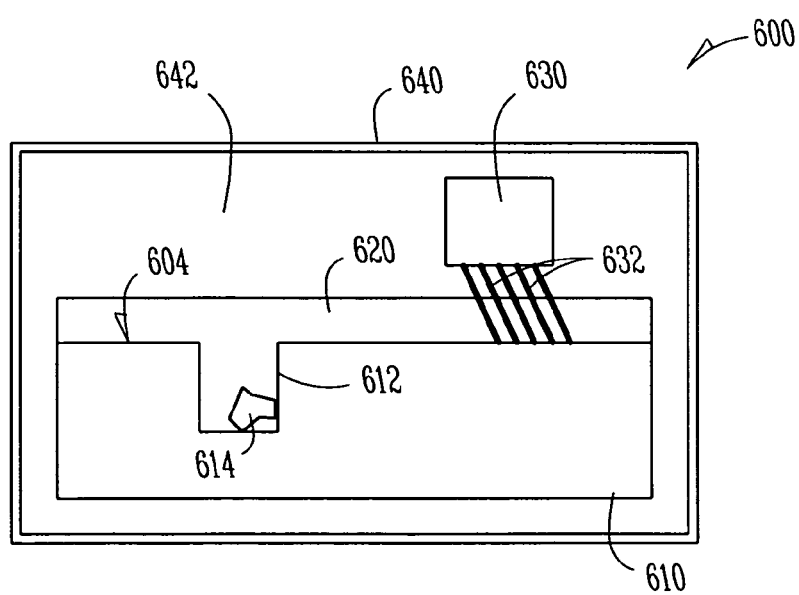
FIG. 6 shows a cleaning system according to an embodiment of the invention.

FIG. 6 shows a cleaning system 600. A portion of a semiconductor 610 is shown including a feature 612. An unwanted particle 614 is shown within the feature. A carrier fluid 620, similar to carrier fluids described in embodiments above, is shown in contact with a surface 604 of the semiconductor 610. Similar to embodiments described above, the surface 604 of the semiconductor, the feature 612 and the particle 614 are contained within a chamber 640. The atmosphere 642 within the chamber 640 can be controlled to produce a supercritical state. As described in embodiments above, mechanical energy for cleaning particles such as particle 614 is provided by altering a supercritical state to produce bubbles.

In addition to the use of the supercritical state for mechanical energy, a brush cleaning system 630 with a number of bristles 632 is shown in block diagram form, in contact with the surface 604. In some embodiments, the mechanical energy supplied by the brush cleaning system 630 is desirable for removal of unwanted particles in addition to the energy provided by the supercritical fluid as described in embodiments above.

Figure 7:
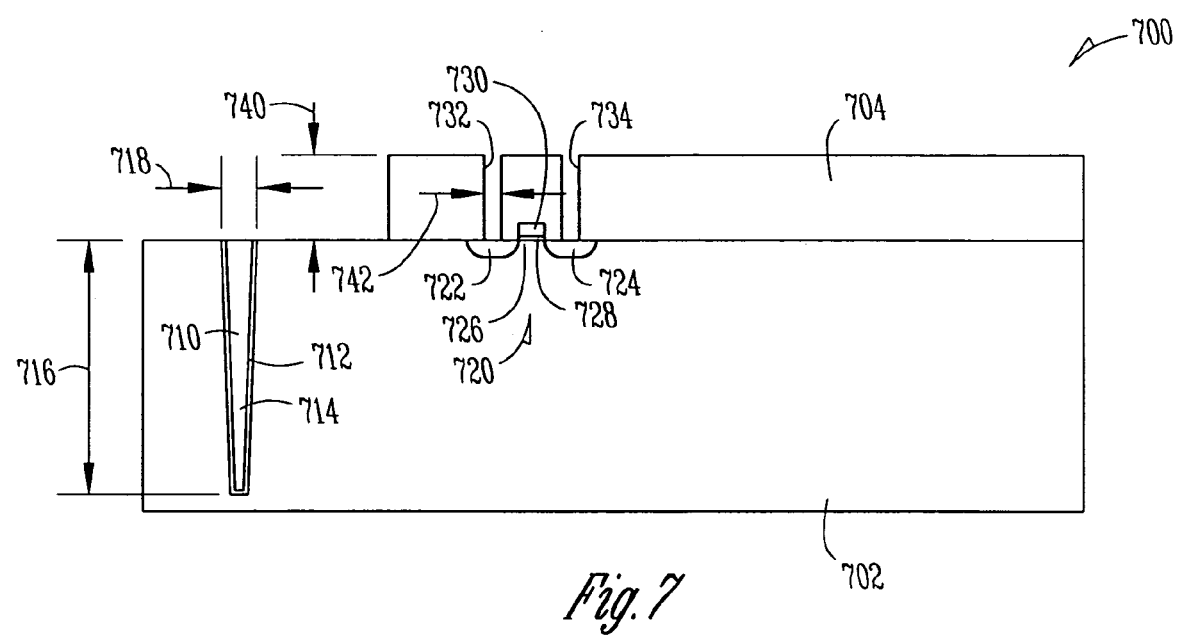
FIG. 7 shows selected electronic devices formed according to an embodiment of the invention.

FIG. 7 shows examples of devices that are fabricated using semiconductor processing techniques. Devices formed using cleaning methods described below include, but are not limited to, trench capacitors and device contacts, etc. Devices shown in FIG. 7 are not necessarily drawn to scale. Further, the devices shown in FIG. 7 are shown isolated from other components, connecting structures, and devices for the purpose of illustration.

A portion of a chip 700 is shown, including a trench capacitor 710 formed in a semiconductor substrate 702. The trench capacitor 710 includes an insulator layer 712 and a plate 714 within the insulator layer 712. In one embodiment, the substrate functions as a second plate of the trench capacitor 710. An aspect ratio of the trench capacitor 710 is shown as the depth 716 divided by the width 718. As shown in FIG. 7, the trench capacitor 710 includes a high aspect ratio design, that requires a deep and narrow trench.

Advantages such as the homogenous supply of energy from a supercritical fluid enables more effective cleaning of high aspect ratio features such as the trench of a trench capacitor 710. While a brush may not penetrate to depths of features such as the trench of a trench capacitor 710, using embodiments as described above, bubbles will form deep within the trench to provide mechanical energy for unwanted particle removal.

A transistor 720 is shown located on the semiconductor substrate 702. The transistor includes a first source/drain region 722, a second source/drain region 724, and a channel region 726 between the first source/drain region 722 and the second source/drain region 724. A dielectric layer 728 is located over the channel region 726, and a gate 730 is located over the dielectric layer 728. Although a lateral transistor configuration is shown as an example, other transistor configurations such as a vertical transistor are also within the scope of the invention. An isolation layer 704 is shown located over and around the transistor 720. Layers such as the isolation layer 704 are used in some integrated circuits to electrically isolate the transistor 720 and to space apart additional layers of devices and interconnection structures (not shown).

When additional layers such as the isolation layer 704 are formed over a transistor 720, electrical connections must be made through the isolation layer 704 to operate the transistor 720. A first opening 732 is shown over the first source/drain region 722, and a second opening 734 is shown over the second source/drain region 724. The thickness 740 of the isolation layer 704 and a width 742 of the openings 732, 734 determines an aspect ratio of the contact openings. Although a conductor structure or device is eventually deposited within the first opening 732 and the second opening 734, it is frequently necessary to clean the opening 732 and the second opening 734 during fabrication.

Similar to the trench capacitor example described above, advantages such as the homogenous supply of energy from a supercritical fluid enables more effective cleaning of high aspect ratio features such the first opening 732 and the second opening 734. While a brush, or sonic energy may not penetrate to depths of features such as the first opening 732 and the second opening 734, using embodiments as described above, bubbles will form deep within the openings to provide mechanical energy for unwanted particle removal.

In one application, after the wafer processing is complete, chips are diced and joined into higher level assemblies. Prior to joining it may be desirable to clean the chips to remove debris from the dicing apparatus. Likewise in one embodiment, after assembly, the narrow spaces between chips and or between chips and the substrate are cleaned to remove unwanted residue from the joining/assembly processing.

Although devices such as a trench capacitor 710 and a transistor 720 are shown as examples of devices that benefit from the cleaning methods described above, the invention is not so limited. Other electronic devices and features are within the scope of the invention.

CONCLUSION

Devices and methods of cleaning described in embodiments above have a number of advantages. Advantages of cleaning using a supercritical fluid include a combination of both chemical and mechanical removal abilities from the supercritical fluid. The mechanical energy in embodiments described above is transmitted in an improved homogenous manner throughout a carrier fluid. The mechanical energy in embodiments described above is also improved in an ability to use with delicate surface features. Supercritical fluid methods as described in embodiments above are also easily integrated into existing cleaning methods.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a semiconductor component, comprising:
    forming a surface feature on a semiconductor surface, the surface feature having a topography;
    cleaning the surface feature, including:
        placing the semiconductor surface in contact with a carrier fluid;
        forming a supercritical fluid adjacent to the semiconductor surface;
        changing a thermodynamic condition of the supercritical fluid to cause gas bubbles in the carrier fluid; and
        concurrently brushing the semiconductor surface with the gas bubble formation.

2. The method of claim 1, wherein forming a supercritical fluid includes forming a carbon dioxide supercritical fluid.

3. The method of claim 1, wherein forming a supercritical fluid includes forming a supercritical fluid from a group consisting of nitrous oxide, ethane, ethylene, propane, and xenon.

4. The method of claim 1, wherein forming a supercritical fluid includes forming a supercritical fluid from a group consisting of ethyl alcohol, ethyl ether and methyl alcohol.

5. A method of forming a semiconductor component, comprising:
    forming a surface feature on a semiconductor surface, the surface feature having a topography;
    cleaning the surface feature, including:
        placing the semiconductor surface in contact with a carrier fluid;
        forming a supercritical fluid adjacent to the semiconductor surface;
        changing a thermodynamic condition of the supercritical fluid to cause gas bubbles in the carrier fluid;
        concurrently brushing the semiconductor surface with the bubble gas formation; and
    providing supplemental mechanical energy to the semiconductor surface.

6. The method of claim 5, wherein providing supplemental mechanical energy to the semiconductor surface includes providing sonic wave energy to the carrier fluid.

7. The method of claim 6, wherein providing sonic wave energy to the carrier fluid includes providing ultrasonic wave energy to the carrier fluid.

8. The method of claim 5, wherein providing supplemental mechanical energy to the semiconductor surface includes brushing the semiconductor surface.

9. The method of claim 5, wherein providing supplemental mechanical energy to the semiconductor surface includes both brushing the semiconductor surface and providing sonic wave energy to the carrier fluid.

10. A method of forming a trench capacitor, comprising:
    forming a trench in a semiconductor surface;
    cleaning the trench, including:
        placing the semiconductor surface in contact with a carrier fluid;
        forming a supercritical fluid adjacent to the semiconductor surface;
        changing a thermodynamic condition of the supercritical fluid to cause gas bubbles in the carrier fluid;
        concurrently brushing the semiconductor surface with the bubble gas formation;
    forming an insulator layer within the trench; and
    forming a conductive plate over the insulator layer.

11. The method of claim 10, wherein forming a supercritical fluid includes forming a carbon dioxide supercritical fluid.

12. The method of claim 10, wherein forming a supercritical fluid includes forming a supercritical fluid from a group consisting of nitrous oxide, ethane, ethylene, propane, and xenon.

13. The method of claim 10, wherein forming a supercritical fluid includes forming a supercritical fluid from a group consisting of ethyl alcohol, ethyl ether and methyl alcohol.

14. The method of claim 10, further including providing sonic wave energy to the carrier fluid.

15. The method of claim 10, further including brushing the semiconductor surface.

16. A method of forming a device contact, comprising:
    forming an opening within an insulator layer located over a device;
    cleaning the opening, including:
        placing the insulator layer in contact with a carrier fluid;
        forming a supercritical fluid adjacent to the insulator layer;
        changing a thermodynamic condition of the supercritical fluid to cause gas bubbles in the carrier fluid;
        concurrently brushing the semiconductor surface with the bubble gas formation; and
    depositing a conductor material within the opening.

17. The method of claim 16, wherein forming a supercritical fluid includes forming a carbon dioxide supercritical fluid.

18. The method of claim 16, wherein forming a supercritical fluid includes forming a supercritical fluid from a group consisting of nitrous oxide, ethane, ethylene, propane, and xenon.

19. The method of claim 16, wherein forming a supercritical fluid includes forming a supercritical fluid from a group consisting of ethyl alcohol, ethyl ether and methyl alcohol.

20. The method of claim 16, wherein forming the opening within the insulator layer located over the device includes forming an opening within an insulator layer located over a portion of a transistor.

21. A method of forming an information handling system, comprising:
    forming a memory device, including:
        fabricating a memory circuit on a semiconductor surface;
        cleaning the semiconductor surface, including:
            placing the semiconductor surface in contact with a carrier fluid;
            forming a supercritical fluid adjacent to the semiconductor surface;
            changing a thermodynamic condition of the supercritical fluid to cause gas bubbles in the carrier fluid;
            concurrently brushing the semiconductor surface with the bubble gas formation; and
    coupling the memory device to a processor device.

22. The method of claim 21, wherein the steps are performed in the order presented.

23. The method of claim 21, wherein forming a memory device includes forming a dynamic random access memory device.

24. The method of claim 21, wherein forming a supercritical fluid includes forming a carbon dioxide supercritical fluid.

* * * * *

UNITED STATES PATENT AND TRADEMARK OFFICE
CERTIFICATE OF CORRECTION

PATENT NO. : 7,655,095 B2
APPLICATION NO. : 11/605065
DATED : February 2, 2010
INVENTOR(S) : Paul A. Farrar It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 413 days.

Signed and Sealed this

Twenty-third Day of November, 2010

David J. Kappos
*Director of the United States Patent and Trademark Office*